(12) United States Patent
Katsumata et al.

(10) Patent No.: US 11,162,993 B2
(45) Date of Patent: Nov. 2, 2021

(54) EVALUATION METHOD, COMBINED EVALUATION METHOD, EVALUATION APPARATUS, AND COMBINED EVALUATION APPARATUS

(71) Applicant: FUJI ELECTRIC CO., LTD., Kanagawa (JP)

(72) Inventors: Hiroki Katsumata, Hino (JP); Michio Tamate, Hachioji (JP); Miwako Fujita, Tachikawa (JP); Tamiko Asano, Hino (JP); Yuhei Suzuki, Suzuka (JP); Takashi Kaimi, Neyagawa (JP); Yuta Sunasaka, Fukuoka (JP); Tadanori Yamada, Matsumoto (JP); Ryu Araki, Matsumoto (JP); Bao Cong Hiu, Kokubunji (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 338 days.

(21) Appl. No.: 16/261,497

(22) Filed: Jan. 29, 2019

(65) Prior Publication Data
US 2019/0170798 A1    Jun. 6, 2019

Related U.S. Application Data

(63) Continuation of application No. PCT/JP2018/004485, filed on Feb. 8, 2018.

(30) Foreign Application Priority Data

Feb. 24, 2017    (JP) .............................. JP2017-034147

(51) Int. Cl.
*G01R 29/08* (2006.01)
*G01R 29/26* (2006.01)
(Continued)

(52) U.S. Cl.
CPC ......... *G01R 29/0814* (2013.01); *G01R 29/00* (2013.01); *G01R 29/08* (2013.01);
(Continued)

(58) Field of Classification Search
CPC ......... G01R 29/26; G01R 29/08; G01R 29/00
See application file for complete search history.

(56) References Cited

U.S. PATENT DOCUMENTS

2001/0033501 A1* 10/2001 Nebrigic ............. H02M 3/1588
363/49
2004/0198078 A1* 10/2004 Otaki ..................... H01R 12/59
439/76.1
(Continued)

FOREIGN PATENT DOCUMENTS

JP          H06309420 A      11/1994
JP          H10307159 A      11/1998
(Continued)

OTHER PUBLICATIONS

International Search Report for International Patent Application No. PCT/JP2018/004485, issued by the Japan Patent Office dated Mar. 13, 2018.

*Primary Examiner* — Alvaro E Fortich

(57) ABSTRACT

The radiated noise of a semiconductor device is conveniently evaluated, and the radiated noise of an apparatus equipped with the semiconductor device is estimated. An evaluation method including: making a semiconductor device that is connected parallel to a load by a load cable, perform a switching operation; measuring common-mode current flowing through the load cable during the switching operation; and outputting an evaluation benchmark for radiated noise based on the common-mode current, and an evaluation apparatus are provided.

20 Claims, 8 Drawing Sheets

(51) Int. Cl.
   G01R 29/00     (2006.01)
   H02M 1/00      (2006.01)
   H02M 7/537         (2006.01)
   H02M 7/217         (2006.01)

(52) U.S. Cl.
   CPC ......... G01R 29/0871 (2013.01); G01R 29/26 (2013.01); H02M 1/00 (2013.01); *H02M 7/217* (2013.01); *H02M 7/537* (2013.01)

(56) References Cited

U.S. PATENT DOCUMENTS

| | | | |
|---|---|---|---|
| 2006/0050820 A1* | 3/2006 | Kawada | H04L 7/00 375/354 |
| 2007/0210847 A1* | 9/2007 | Baudesson | H02M 1/12 327/283 |
| 2008/0116996 A1* | 5/2008 | Wasaki | H03H 7/427 333/175 |
| 2013/0016548 A1* | 1/2013 | Seki | H01L 25/18 363/131 |
| 2017/0020037 A1* | 1/2017 | Nakatani | H01B 9/021 |

FOREIGN PATENT DOCUMENTS

| | | | |
|---|---|---|---|
| JP | 2005233833 A | 9/2005 |
| JP | 2009290938 A | 12/2009 |
| JP | 2014135095 A | 7/2014 |

* cited by examiner

300

EVALUATION METHOD, COMBINED EVALUATION METHOD, EVALUATION APPARATUS, AND COMBINED EVALUATION APPARATUS

The contents of the following Japanese patent application (s) are incorporated herein by reference:
NO. 2017-034147 filed in JP on Feb. 24, 2017, and
NO. PCT/JP2018/004485 filed on Feb. 8, 2018.

1. TECHNICAL FIELD

The present invention relates to an evaluation method, a combined evaluation method, an evaluation apparatus, and a combined evaluation apparatus.

2. RELATED ART

For electromagnetic noise (conducted and radiated types) generated by electrical/electronic equipment including power conversion apparatuses such as inverters and PWM rectifiers, a limit value is set by EMC (Electro-Magnetic Compatibility) standards, and it is required to sufficiently reduce the electromagnetic noise. A method has been proposed for evaluating such electromagnetic noise generated during the operation of a power conversion apparatus by means of simulation or simple measurement (for example, see Patent Documents 1 to 3).

Patent Document 1: Japanese Patent Application Publication No. Hei. 6-309420
Patent Document 2: Japanese Patent Application Publication No. 2014-135095
Patent Document 3: Japanese Patent Application Publication No. 2005-233833

SUMMARY

Such simulation uses analysis models. However, the analysis models can only be created after determining the details, such as a circuit board and housing structure, of the power conversion apparatus. In addition, the electromagnetic noise evaluation by means of simple measurement can only be performed after completing the power conversion apparatus. Therefore, the electromagnetic noise may be evaluated as "not conforming to the standards" after completing the power conversion apparatus, in which case EMC filter design, parts selection, circuit board artwork, structure consideration and the like needs to be conducted again.

(Item 1)
An evaluation method may include making a semiconductor device that is connected parallel to a load via a load cable, perform a switching operation.

The evaluation method may include measuring common-mode current flowing through the load cable during the switching operation.

The evaluation method may include outputting an evaluation benchmark for radiated noise based on the common-mode current.

(Item 2)
The outputting the evaluation benchmark may calculate, as the evaluation benchmark for the radiated noise, radiated electric field strength of a frequency component included in the common-mode current.

(Item 3)
At least part of the load cable may be covered with metal shield.

(Item 4)
The metal shield may be electrically connected to a conductive member to which the semiconductor device is attached having an insulation material between the semiconductor device and the conductive member.

(Item 5)
The conductive member may be part of a temperature adjustment unit to adjust the temperature of the semiconductor device.

(Item 6)
The evaluation method may include comparing the evaluation benchmark output for the semiconductor device and an evaluation benchmark output for a reference device different from the semiconductor device.

The evaluation method may include evaluating an intensity of the radiated noise of the semiconductor device relative to the reference device based on a result of the comparison.

(Item 7)
A combined evaluation method may be an estimating method for estimating radiated noise of an apparatus provided with the semiconductor device. The combined evaluation method may include acquiring a plurality of evaluation benchmarks for the semiconductor device that are output in correspondence with the switching operation under a plurality of conditions by using the evaluation method according to any one of items 1 to 6.

The combined evaluation method may include combining the plurality of evaluation benchmarks to estimate the radiated noise of the apparatus.

(Item 8)
The combination of the evaluation benchmarks may be a maximum value or a sum of the plurality of evaluation benchmarks for the semiconductor device.

(Item 9)
The combination of the evaluation benchmarks may be an average value of the plurality of evaluation benchmarks for the semiconductor device.

(Item 10)
The combination of the evaluation benchmarks may be an average value calculated after multiplying the plurality of evaluation benchmarks for the semiconductor device by respective weights corresponding to the plurality of conditions.

(Item 11)
The evaluation apparatus may include a load that is electrically connected parallel to the semiconductor device.

The evaluation apparatus may include a load cable electrically connecting the semiconductor device and the load.

The evaluation apparatus may include a signal supplying unit configured to supply predetermined switching signals to the semiconductor device.

The evaluation apparatus may include a detection unit configured to detect common-mode current flowing through the load cable.

The evaluation apparatus may include an evaluation benchmark output unit configured to output evaluation benchmarks of radiated noise of the semiconductor device based on a detection result of the detection unit.

(Item 12)
At least part of the load cable may be covered with a metal shield.

(Item 13)
The detection unit may be provided at an area different from an area of the cable that is covered with the metal shield.

(Item 14)

The metal shield may be electrically connected to a conductive member to which a substrate where the semiconductor device is arranged having an insulation material between the semiconductor device and the conductive member, is fixed.

(Item 15)

The conductive member may be part of a temperature adjustment unit to adjust the temperature of the semiconductor device.

(Item 16)

The evaluation apparatus may include a power supply.

The evaluation apparatus may include a plurality of capacitive units that are each connected parallel to the semiconductor device.

(Item 17)

At least one capacitive unit of the plurality of capacitive units may have a first capacitive element and a second capacitive element that are connected in series.

A node between the first capacitive element and the second capacitive element may be connected to a reference potential.

(Item 18)

The semiconductor device may include a first device and a second device that are connected in series.

The load cable may have a first connection line, one end of which is connected to one end of the first device.

The load cable may have a second connection line, one end of which is connected to the other end of the first device.

The load cable may have a load connected between the other end of the first connection line and the other end of the second connection line.

The signal supplying unit may supply the switching signal to the second device.

(Item 19)

The detection unit may have a current probe to detect the common-mode current flowing from the first device to the load through the first connection line and the second connection line.

(Item 20)

The evaluation apparatus may include a storage unit configured to store the evaluation benchmark output by the evaluation benchmark output unit.

The evaluation apparatus may include a comparison unit configured to compare the evaluation benchmark output by the evaluation benchmark output unit and an evaluation benchmark for a reference device different from the semiconductor device stored in the storage unit.

The evaluation apparatus may include an evaluation unit configured to evaluate a relative change in intensity of the radiated noise of the semiconductor device according to a result of the comparison.

(Item 21)

The evaluation apparatus may include an acquisition unit configured to acquire a plurality of evaluation benchmarks for the semiconductor device that are output by the evaluation apparatus according to any one of items 11 to 20 in correspondence with the switching signal under a plurality of conditions.

The evaluation apparatus may include an estimation unit configured to combine the plurality of evaluation benchmarks to estimate radiated noise of an apparatus provided with the semiconductor device.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
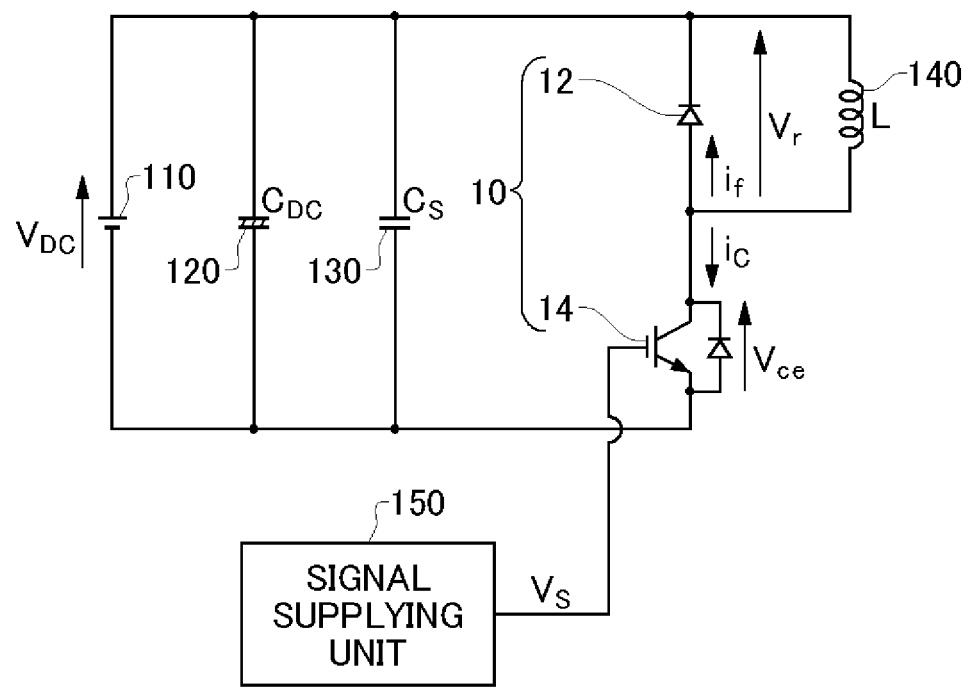
FIG. 1 shows an example configuration of an evaluation circuit 100 for evaluating switching characteristics of a semiconductor device 10.

FIG. 1 shows an example configuration of an evaluation circuit 100 for evaluating switching characteristics of a semiconductor device 10. An example is shown in which the to-be-evaluated semiconductor device 10 includes a first device 12 and a second device 14 connected in series. FIG. 1 shows an example in which the first device 12 is a diode and the second device 14 consist of a combination of a semiconductor switch such as an IGBT and a diode anti-parallel connected thereto. Using the evaluation circuit 100 shown in FIG. 1, switching losses, voltage overshoots and the like of the semiconductor device 10 can be evaluated by performing turn-on operations, turn-off operations and the like of the second device 14. The evaluation circuit 100 includes a power supply 110, a first capacitive unit 120, a second capacitive unit 130, a load reactor 140, and a signal supplying unit 150.

The power supply 110 is a DC power supply which outputs a DC voltage $V_{DC}$. The power supply 110 is connected to both ends of the semiconductor device 10. For example, the power supply 110 is connected to one end (the cathode terminal) of the first device 12 and the other end (the emitter terminal) of the second device 14, and supplies the DC voltage to the first device 12 and the second device 14. In this case, the other end (the anode terminal) of the first device 12 is connected to one end (the collector terminal) of the second device 14.

The first capacitive unit 120 is connected parallel to the semiconductor device 10, and smoothens the DC voltage $V_{DC}$ output from the power supply 110. The first capacitive unit 120 is a capacitor having a capacitance $C_{DC}$, for example. The first capacitive unit 120 is an electrolytic capacitor, as an example. The second capacitive unit 130 is connected parallel to the semiconductor device 10, and reduces voltage overshoots. The second capacitive unit 130 is a capacitor having a capacitance $C_S$, for example. It is desirable that the first capacitive unit 120 and the second capacitive unit 130 are capacitors having different capacitances, for example, the capacitance $C_{DC}$ is larger than the capacitance $C_S$.

The load reactor 140 is connected to both ends the first device 12. The load reactor 140 has an inductance L, as an example.

The signal supplying unit 150 supplies a predetermined switching signal to the semiconductor device 10. For example, the signal supplying unit 150 includes a pulse generator, an amplification circuit and the like, and supplies a pulsed switching signal $V_S$ to the gate terminal of the second device 14. In the second device 14, when the switching signal $V_S$ is supplied to the gate terminal, the electrical connection between the collector terminal and the emitter terminal is switched between a connected state (ON state) and a disconnected state (OFF state).

In the above evaluation circuit 100, the semiconductor device 10 can be caused to perform switching operations by supplying the switching signal to the second device 14. Therefore, switching characteristics of the second device 14 can be acquired by, for example, measuring a collector current $i_c$ flowing in the collector terminal during the switching operations with an external measurement apparatus or the like.

Also, the switching characteristics of the first device 12 can be evaluated by measuring a forward current $i_f$ flowing in the first device 12 during the switching operations with an external measurement apparatus or the like. Note that the voltage between the collector and emitter terminals of the second device 14 is referred to as $V_{ce}$, and the voltage across the first device 12 is referred to as $V_r$. The measurement of the switching characteristics using the evaluation circuit 100 is described as follows.

Figure 2:
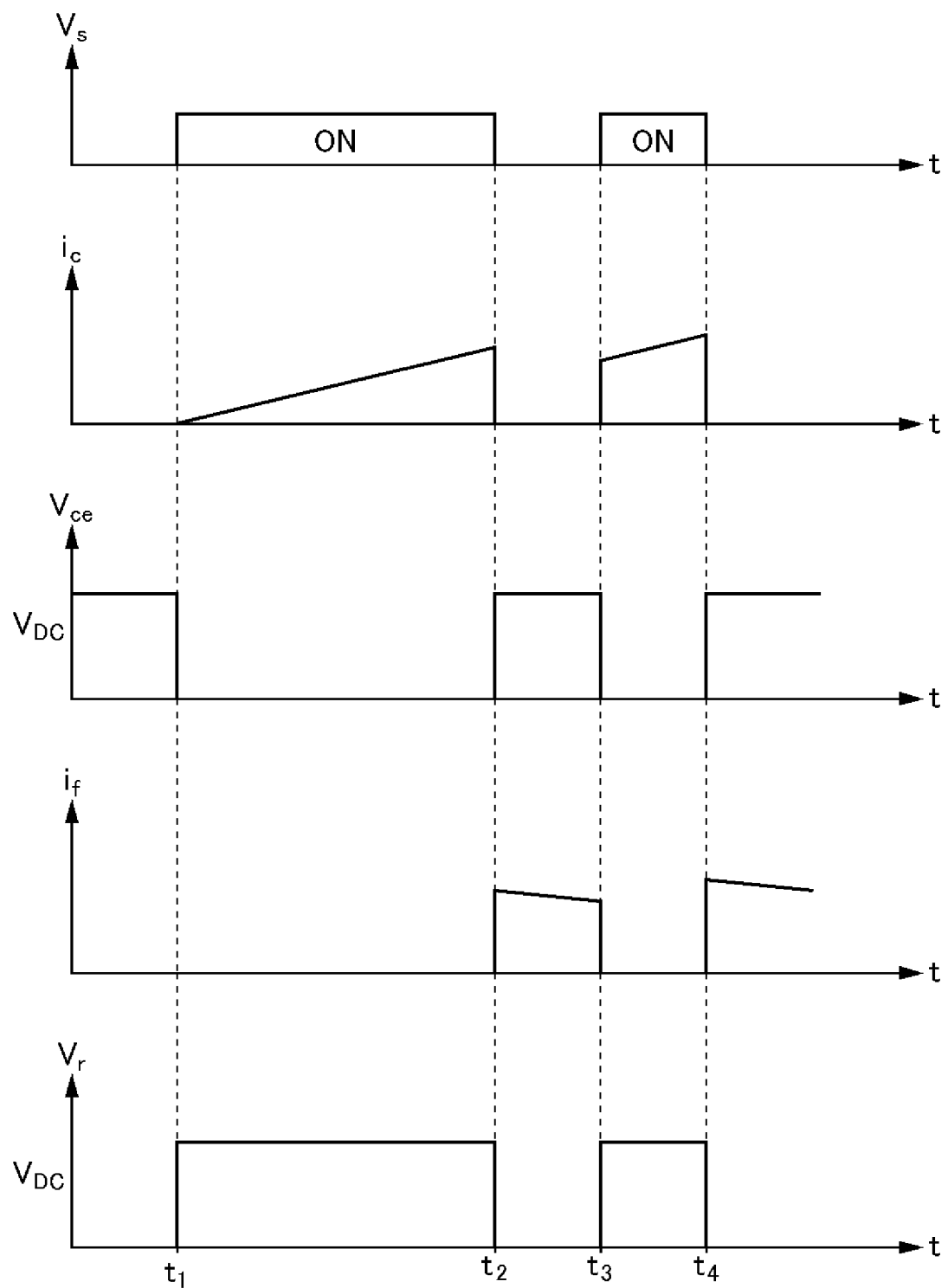
FIG. 2 shows an example of the result of measuring the switching characteristics of the semiconductor device 10 using the evaluation circuit 100.

FIG. 2 shows an example of the result of measuring the switching characteristics of the semiconductor device 10 using the evaluation circuit 100. In FIG. 2, the horizontal axis indicates time and the vertical axis indicates voltage values or current values. FIG. 2 shows an example in which the evaluation circuit 100 switches the second device 14 between the ON state and the OFF state with the switching signal $V_S$ to cause the second device 14 to perform turn-on operations and turn-off operations.

At time $t_1$, the switching signal $V_S$ becomes a high voltage and turns the second device 14 to the ON state. When conduction is made between the collector terminal and the emitter terminal of the second device 14, current flows from the power supply 110 through the load reactor 140 into the second device 14. The current flowing into the second device 14 is observed as a collector current $i_c$, and increases at a substantially constant rate of change di/dt from time $t_1$. The rate of change di/dt is represented by the following equation.

$$\frac{di}{dt} = \frac{V_{DC}}{L} \quad \text{(Equation 1)}$$

At time $t_2$, the switching signal $V_S$ becomes a low voltage and turns the second device 14 to the OFF state. In the evaluation circuit 100, the time period from time $t_1$ to time $t_2$ may be set such that the second device 14 is switched to the OFF state at the time point when a predetermined amount of the collector current $i_c$ flows. In this manner, in the evaluation circuit 100, the turn-off operation of the second device 14 can be performed under a predetermined condition of the collector current $i_c$. That is, the transient response of the second device 14 for its turn-off operation under a predetermined condition of the collector current $i_c$ can be measured.

The voltage $V_{ce}$ between the collector and emitter terminals is substantially the same as the DC voltage $V_{DC}$ during the time period until time $t_1$, in which the second device 14 is in the OFF state. During the time period from time $t_1$ to time $t_2$, the second device 14 is in the ON state, and thus the voltage $V_{ce}$ between the terminals is substantially 0 V. During the time period until time $t_2$, no current flows in the first device 12, and thus the forward current $i_f$ is substantially 0 A. The voltage $V_r$ across the first device 12 is substantially 0 V until time $t_1$, and is substantially the same as the DC voltage $V_{DC}$ during the time period from time $t_1$ to time $t_2$.

When the second device 14 is turned to the OFF state at time $t_2$, the load reactor 140 acts to continuously pass the current that has been flowing therein, and therefore the current refluxes along a path from the load reactor 140 to the first device 12. Therefore, the forward current $i_f$ of the first device 12 rises at time $t_2$, and its current value gradually decreases over time. Note that the rising of the forward current $i_f$ of the first device 12 at time $t_2$ is referred to as a forward recovery operation. By turning the second device 14 to the ON state while the forward current $i_f$ flows in the first device 12, a reverse recovery operation of the first device 12 and a turn-on operation of the second device 14 can be performed.

In the evaluation circuit 100, the time period from time $t_2$ to time $t_3$ may be set such that the second device 14 is switched to the ON state at the time point when a predetermined amount of the forward current $i_f$ flows. In this manner, in the evaluation circuit 100, the reverse recovery operation of the first device 12 and the turn-on operation of the second device 14 can be performed under a predetermined condition of the forward current $i_f$. That is, the transient response of the second device 14 and the first device 12 for the turn-on operation of the second device 14 under a predetermined condition of the forward current $i_f$ can be measured.

Thus, at time $t_3$, the switching signal $V_S$ becomes a high voltage again and turns the second device 14 to the ON state. The voltage $V_{ce}$ between the terminals of the second device 14 is substantially the same voltage as the DC voltage $V_{DC}$ during the time period from time $t_2$ to time $t_3$, in which the second device 14 is in OFF state, and becomes substantially 0 V again from time $t_3$. The voltage $V_r$ across the first device 12 is substantially 0 V during the time period from time $t_2$ to time $t_3$, and becomes substantially the same as the DC voltage $V_{DC}$ again from time $t_3$.

The forward recovery operation of the first device 12 and the turn-off operation of the second device 14 can be observed at least partially in the same time region with the same switching signal $V_S$. Similarly, the reverse recovery operation of the first device 12 and the turn-on operation of the second device 14 can be observed at least partially in the same time region with the same switching signal $V_S$.

For example, a case is considered in which the signal supplying unit 150 supplies the switching signal $V_S$ to the gate terminal of the second device 14 to cause the second device 14 to perform a turn-on operation. In this case, turn-on characteristics of the second device 14 can be observed by detecting the transient response of the voltage $V_{ce}$ between the collector and emitter terminals of the second device 14. Also, forward recovery characteristics of the first device 12 can be observed by detecting the current $i_f$ flowing in the first device 12.

Similarly, a case is considered in which the signal supplying unit 150 supplies the switching signal $V_S$ to the gate terminal of the second device 14 to cause the second device 14 to perform a turn-off operation. In this case, turn-off characteristics of the second device 14 can be observed by detecting the voltage $V_{ce}$ between the collector and emitter terminals of the second device 14. Also, reverse recovery characteristics of the first device 12 can be observed by detecting the current $i_f$ flowing in the first device 12.

The switching characteristics of the semiconductor device 10 are thus measured using the evaluation circuit 100 and, for example, if evaluated to be a non-defective product that meets a predetermined criteria, the semiconductor device 10 is shipped to the market or the like. However, even if a power conversion apparatus or the like is manufactured using the semiconductor device 10 with good switching characteristics, electromagnetic noise generated by the power conversion apparatus may exceed a standard value defined by the EMC standards. In this case, EMC filter design, re-selection of parts including the semiconductor device 10, circuit board artwork, structure consideration and the like needs to be conducted again after completing the power conversion apparatus, and enormous trouble and cost would occur.

Thus, in addition to evaluating the switching characteristics of the semiconductor device 10, the evaluation apparatus 200 according to the present embodiment evaluates radiated noise of the semiconductor device 10 and outputs an evaluation benchmark. In this manner, radiated noise generated by a power conversion apparatus or the like equipped with the semiconductor device 10 can be estimated before completing the power conversion apparatus, so that the trouble and cost involved in the manufacturing process are reduced. Such an evaluation apparatus 200 is described as follows.

Figure 3:
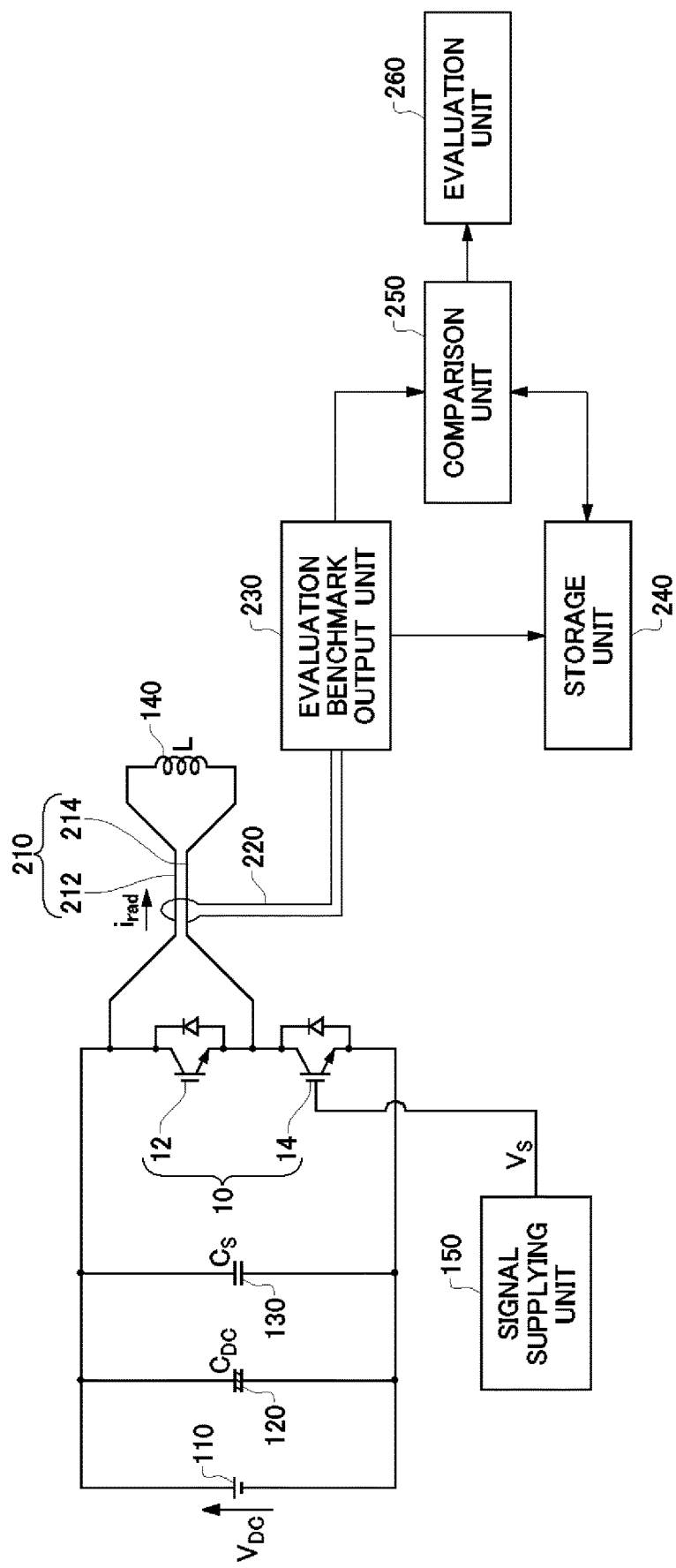
FIG. 3 shows an example configuration of an evaluation apparatus 200 in the present embodiment together with the to-be-evaluated semiconductor device 10.

FIG. 3 shows an example configuration of an evaluation apparatus 200 in the present embodiment together with the to-be-evaluated semiconductor device 10. The configuration of the evaluation apparatus 200 is partially similar to that of the evaluation circuit 100 shown in FIG. 1. Therefore, the evaluation apparatus 200 can be used to evaluate the switching characteristics of the semiconductor device 10 described with reference to FIG. 1 and FIG. 2. The evaluation apparatus 200 includes a power supply 110, a first capacitive unit 120, a second capacitive unit 130, a load reactor 140, a signal supplying unit 150, a load cable 210, a detection unit 220, an evaluation benchmark output unit 230, a storage unit 240, a comparison unit 250, and an evaluation unit 260.

The power supply 110, the first capacitive unit 120, the second capacitive unit 130, the load reactor 140, and the signal supplying unit 150 shown in FIG. 3 operate in substantially the same manner as the power supply 110, the first capacitive unit 120, the second capacitive unit 130, the load reactor 140 and the signal supplying unit 150 described with reference to FIG. 1, and they are given the same references. Therefore, the description thereof will not be repeated here.

FIG. 3 shows an example in which the to-be-evaluated semiconductor device 10 includes a first device 12 and a second device 14 connected in series. The first device 12 and the second device 14 are semiconductor switches such as MOSFET or IGBT. FIG. 3 shows an example in which the first device 12 and the second device 14 are IGBTs to which respective diodes are anti-parallel connected.

The load cable 210 is electrically connected to the to-be-evaluated semiconductor device 10. The load cable 210 has a first connection line 212 and a second connection line 214. In the first connection line 212, one end is connected to one end of the first device 12, and the other end is connected to one end of the load reactor 140. In the second connection line 214, one end is connected to the other end of the first device 12, and the other end is connected to the other end of the load reactor 140. That is, the load reactor 140 is connected between the other end of the first connection line 212 and the other end of the second connection line 214. Note that one end of the first device 12 is a collector terminal, and the other end thereof is an emitter terminal.

Common-mode current $i_{rad}$ flowing through the load cable 210 can be expressed as the difference in respective currents flowing through the first connection line 212 and the second connection line 214 at any moment.

The detection unit 220 can detect the common-mode current $i_{rad}$ flowing through the load cable 210. The detection unit 220 detects the common-mode current $i_{rad}$, for example, by detecting an electric field and/or a magnetic field generated corresponding to the common-mode current $i_{rad}$. The detection unit 220 has, as an example, a current probe to detect the common-mode current flowing from the first device 12 to the load reactor 140 through the first connection line 212 and the second connection line 214.

The evaluation benchmark output unit 230 outputs an evaluation benchmark for the radiated noise of the semiconductor device 10 based on the detection result of the detection unit 220. The evaluation benchmark output unit 230 outputs frequency components of the common-mode current detected by the detection unit 220 as the evaluation benchmark for the radiated noise. The evaluation benchmark output unit 230, for example, calculates, as the evaluation benchmark for radiated noise radiated electric field strength of a frequency component included in the common-mode current. As an example, the evaluation benchmark output unit 230 includes a measurement instrument for performing frequency domain measurement such as a spectrum analyzer, and outputs the result of the frequency domain measurement as the evaluation benchmark. Also, the evaluation benchmark output unit 230 includes an instrument for time domain measurement such as an oscilloscope, and performs the Fourier transform on the result of the time domain measurement to convert it into frequency domain data and outputs it as the evaluation benchmark. The evaluation benchmark output unit 230 supplies the evaluation benchmark to the storage unit 240 and the comparison unit 250.

The storage unit 240 stores the evaluation benchmark output by the evaluation benchmark output unit 230. For example, the storage unit 240 stores the evaluation benchmark by associating it with the to-be-evaluated semiconductor device 10 evaluated by the evaluation apparatus 200. As an example, the storage unit 240 may serve as an evaluation benchmark database storing previous evaluation benchmarks output by the evaluation apparatus 200 after performing evaluations. Note that the storage unit 240 may be provided either internal or external to the evaluation apparatus 200. Also, the storage unit 240 can be a database connected to the body of the evaluation apparatus 200 via a network or the like.

The comparison unit 250 compares the evaluation benchmark output by the evaluation benchmark output unit 230 at the present cycle and a previous evaluation benchmark for a reference device different from the semiconductor device 10 stored in the storage unit 240. Here, the semiconductor device 10 may be an improved version of the reference device. In this case, the comparison unit 250 compares an evaluation benchmark for the reference device before the improvement and an evaluation benchmark for the semiconductor device 10 after the improvement.

The evaluation unit 260 evaluates the relative change in intensity of the radiated noise of the semiconductor device 10 based on the comparison result of the comparison unit 250. The evaluation unit 260 outputs an evaluation result. The evaluation unit 260 outputs the evaluation result to a display device, an external database, or the like. The evaluation unit 260 may output the evaluation result in a predetermined format such as a data sheet.

The above evaluation apparatus 200 according to the present embodiment evaluates the radiated noise of the semiconductor device 10 by causing the semiconductor device 10 described with reference to FIG. 1 and FIG. 2 to perform switching operations. The operations of evaluation on the semiconductor device 10 by the evaluation apparatus 200 are described as follows.

Figure 4:
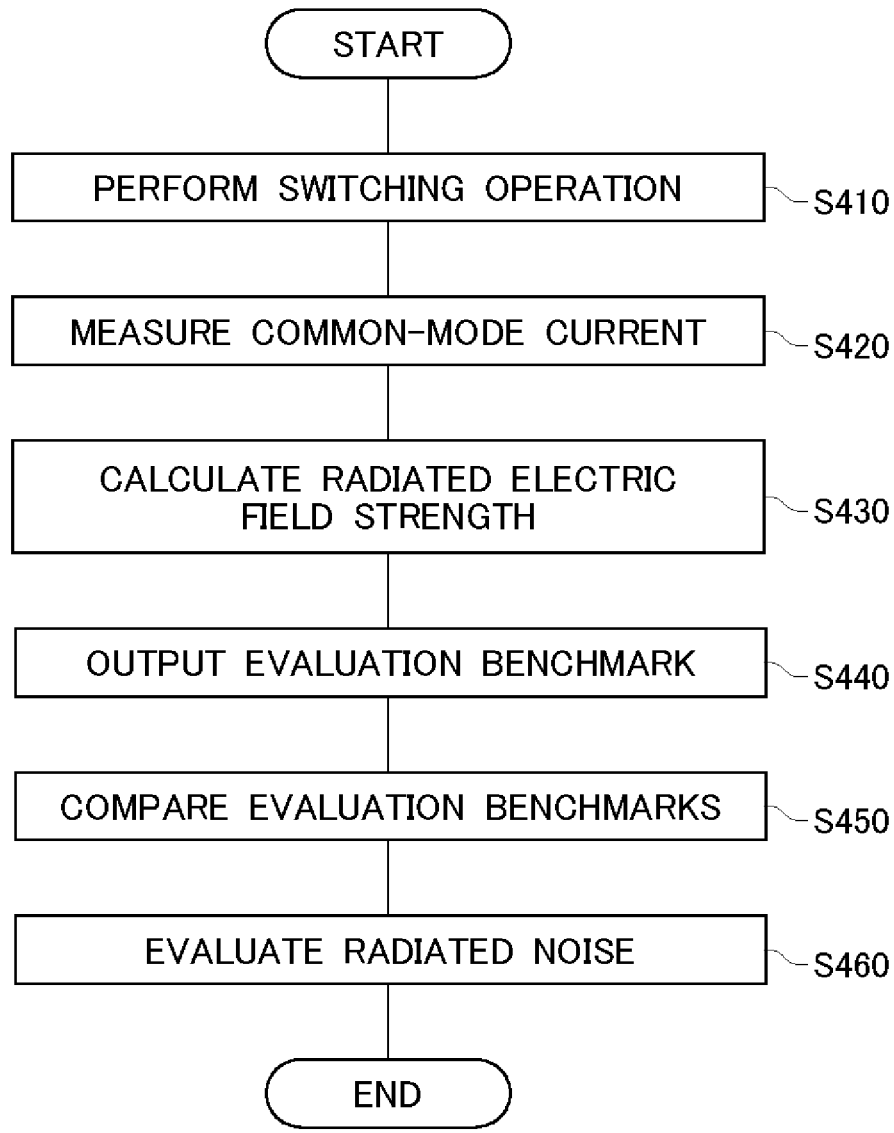
FIG. 4 shows an operation flow of the evaluation apparatus 200 according to the present embodiment.

FIG. 4 shows an operation flow of the evaluation apparatus 200 according to the present embodiment. The evaluation apparatus 200 performs the operations of S410 to S460 shown in FIG. 4 to evaluate the radiated noise of the to-be-evaluated semiconductor device 10.

First, the semiconductor device 10, to which the load cable 210 is electrically connected, is caused to perform a switching operation (S410). That is, make the semiconductor device 10 connected parallel to the load through the load cable 210, perform the switching operation. For example, the signal supplying unit 150 supplies the switching signal $V_S$ shown in FIG. 2 to the gate terminal of the second device 14, to cause switching operations such as a forward recovery operation and a reverse recovery operation of the first device 12 and a turn-on operation and a turn-off operation of the second device 14.

The detection unit 220 measures the common-mode current flowing through the load cable 210 during the switching operation of the semiconductor device 10 (S420). For example, the evaluation benchmark output unit 230 performs frequency conversion on time waveforms of the common-mode current detected by the detection unit 220, to calculate frequency components. The evaluation benchmark output unit 230 may also include a device for frequency domain measurement such as a spectrum analyzer, to measure the frequency components of the common-mode current.

Next, calculate the radiated electric field strength, based on the measurement result of the common-mode current (S430). The evaluation benchmark output unit 230 calculates the radiated electric field strength of the radiated noise of the semiconductor device 10, for example, based on the frequency component of the common-mode current. As an example, the evaluation benchmark output unit 230 calculates the radiated electric field strength using the following equation:

$$E(f, \theta) = \int_0^l \frac{\mu_0 \cdot f}{2 \cdot r} \sin(\theta) \cdot I(f, x) \cdot e^{-j\beta(r - x\cos\theta)} dx [V/m] \quad \text{(Equation 2)}$$

Here, Equation 2 is a formula known as the theoretical operation formula of the dipole antenna radiation. In Equation 2, f denotes frequency (Hz), l denotes dipole line length (m), r denotes measurement distance (m), $\beta$ denotes wavenumber (m$^{-1}$), I denotes current flowing through minute dipole (A), x denotes location on the antenna, $\mu_0$ denotes vacuum magnetic permeability (H/m), $\varepsilon_0$ denotes vacuum dielectric constant (F/m), $2\pi f/v = 2\pi f (\mu_0 \cdot \varepsilon_0)^{1/2}$, and v denotes speed of light (m/s).

The evaluation benchmark output unit 230 calculates the radiated electric field strength within a predetermined frequency range. Note that the evaluation apparatus 200 may change the location of the detection unit 220 on the load cable 210 and observe the frequency component of the common-mode current at a plurality of locations. In this case, the evaluation benchmark output unit 230 may calculate radiated electric field strengths corresponding to the frequency components of the plurality of the common-mode currents, and output an evaluation benchmark obtained by combining them.

Next, output the evaluation benchmark for radiated noise based on the common-mode current (S440). The evaluation benchmark output unit 230 outputs, for example, the frequency characteristics of the calculated radiated electric field strength, as the evaluation benchmark for the radiated noise. Here, the evaluation benchmark is a calculated result of the radiated electric field strength (radiated electric field strength spectrum) within the predetermined frequency band e.g. within 30 MHz to 1 GHz. The evaluation benchmark output unit 230 may output the evaluation benchmark to the storage unit 240 to be stored therein, and also, may supply the evaluation benchmark to the evaluation unit 260. Also, the evaluation benchmark output unit 230 may output the radiated electric field strength spectrum as part of a data sheet of the semiconductor device 10.

Next, the evaluation benchmark output for the semiconductor device 10 and an evaluation benchmark previously output for a reference device different from the semiconductor device 10 are compared (S450). For example, the comparison unit 250 reads out the previous evaluation benchmark from the storage unit 240, and compares the evaluation benchmark output by the evaluation benchmark output unit 230 and the previous evaluation benchmark. The comparison unit 250 calculates the differential spectrum between the evaluation benchmarks in a predetermined frequency band, as an example.

Next, the relative change in intensity of the radiated noise of the semiconductor device 10 is evaluated based on the comparison result (S460). For example, the evaluation unit 260 may use the differential spectrum as the relative change in intensity. The evaluation unit 260 may also use a value in the differential spectrum corresponding to a predetermined frequency as the relative change in intensity. The evaluation unit 260 may also use the average value of values in the differential spectrum corresponding to a plurality of predetermined frequencies as the relative change in intensity.

The evaluation unit 260 outputs the relative change in intensity as an evaluation result. The evaluation unit 260 may output the evaluation result for each type of switching operation of the semiconductor device 10. Also, the evaluation unit 260 may output the evaluation results based on the locations of the detection unit 220 on the load cable 210. As an example, if the reference device is a device with which an apparatus or the like has previously been equipped, the relative change in intensity will be a benchmark for the relative change in radiated electric field strength caused due to the equipment of the apparatus or the like with the semiconductor device 10. If the reference device is substantially the same as the semiconductor device 10, the relative change in intensity will be a benchmark for the manufacturing variability or change over time of the devices, difference between structures in which the devices are implemented, or the like.

The evaluation apparatus 200 according to the present embodiment can evaluate the radiated noise of the semiconductor device 10 and output the evaluation result in the above operation flow. Note that, while an example has been described above in which the evaluation apparatus 200 outputs the relative change in intensity, which is the difference from a previous evaluation benchmark, as the evaluation result, this is not so limited. The evaluation apparatus 200 may also output an evaluation benchmark indicating the absolute frequency spectrum calculated by the evaluation benchmark output unit 230. Also, the evaluation apparatus 200 may output, as an alternative to the strength spectrum of the radiated electric field strength, the frequency component of the common-mode current as the evaluation benchmark. If the evaluation apparatus 200 is an apparatus for outputting the evaluation benchmark, the comparison unit 250 and the evaluation unit 260 may be absent.

Figure 5:
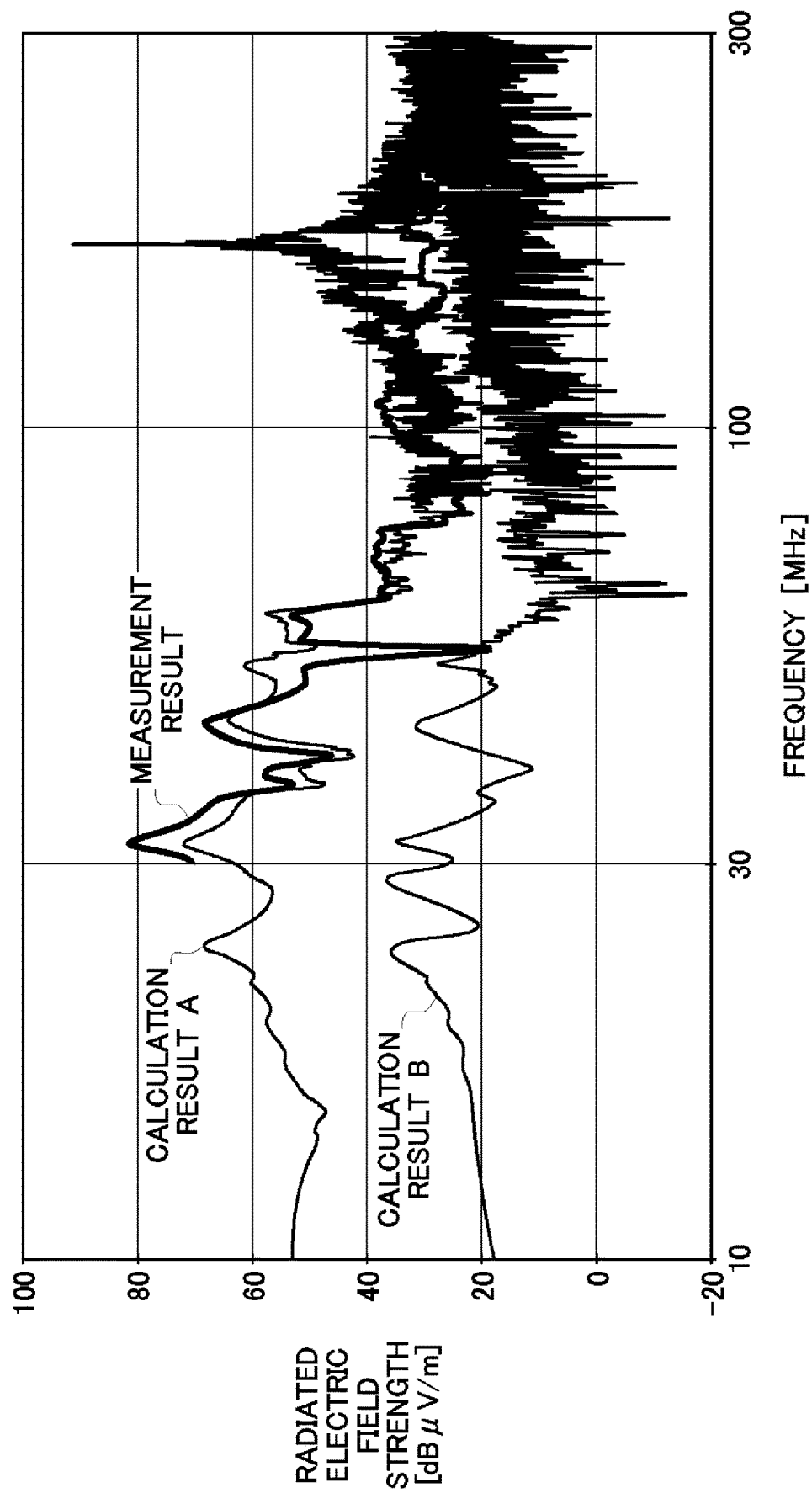
FIG. 5 shows an example of evaluation benchmarks output by an evaluation benchmark output unit 230 according to the present embodiment.

FIG. 5 shows an example of evaluation benchmarks output by an evaluation benchmark output unit 230 according to the present embodiment. FIG. 5 shows an exemplary case where the evaluation benchmark output unit 230 calculates the evaluation benchmark of the semiconductor device 10 within the frequency band 10 MHz to 300 MHz. Also, FIG. 5 shows, as the "measurement result", a result obtained by measuring radiated noise that is caused by making the semiconductor device 10 perform switching operations that are similar to switching operations used for deriving "calculation result A" and "calculation result B".

Also, FIG. 5 shows, as "calculation result A", a radiated electric field strength spectrum that is obtained by calculation using the common-mode current $i_{rad}$ flowing through the load cable 210 and the theoretical formula of the dipole antenna radiation. By comparing the spectrums in "calculation result A" with the "measurement result", it is seen that "calculation result A" almost coincides with the "measurement result" in their values. That is, it is seen that, as the main factor of the radiated noise radiated from the semiconductor device 10, the dipole antenna radiation from electric wiring, etc. is dominant. Accordingly, it is seen that the evaluation benchmark output by the evaluation apparatus 200 based on the common-mode current is an accurate benchmark that indicates the radiated noise of the semiconductor device 10.

Also, FIG. 5 show, as "calculation result B", a radiated electric field strength spectrum that is obtained by calculation using the theoretical formula of the loop antenna radiation. In FIG. 3, "Calculation result B" shows a radiated noise by the loop antenna that is formed of a loop path from one end of the second capacitive unit 130, through the semiconductor device 10, to the other end of the second capacitive unit 130. "Calculation result B" is an exemplary result obtained by calculation using the frequency component of loop current that is observed flowing through the loop path during the switching operation of the semiconductor device 10, and the following equation:

$$E = \frac{\pi \cdot \mu_0 \cdot f^2 \cdot S \cdot I}{v \cdot r} = 1.316 \times 10^{-14} \frac{f^2 \cdot S \cdot I}{r} [V/m] \quad \text{(Equation 3)}$$

Note that the loop current may be acquired by observing the current flowing through the semiconductor device 10 during the switching operation of the semiconductor device 10. Equation 3 is a formula known as the theoretical operation formula of the loop antenna radiation. In Equation 3, f denotes frequency (Hz), S denotes loop area (m$^2$), $\mu_0$ denotes vacuum magnetic permeability (H/m), I denotes current flowing through the loop path (A), r denotes measurement distance (m), and v denotes speed of light (m/s).

By comparing the spectrums in "calculation result B" with the "measurement result", it is seen that "calculation result B" is considerably smaller than the "measurement result" in their values. Accordingly, it is seen that, by the evaluation apparatus 200 detecting the common-mode current, the radiated noise of the semiconductor device 10 can be evaluated.

It has been described that the evaluation apparatus 200 according to the present embodiment described above evaluates the radiated noise of the semiconductor device 10 by observing the common-mode current flowing through the load cable 210. The common-mode current is considered to flow through the stray capacitance between the both load cable 210 and the load reactor, and the reference potential such as the earth, and thus measurement systems are desired to make such stray capacitance remain stable.

Thus, an evaluation apparatus 200 that can measure the common-mode current having better reproducibility is described next.

Figure 6:
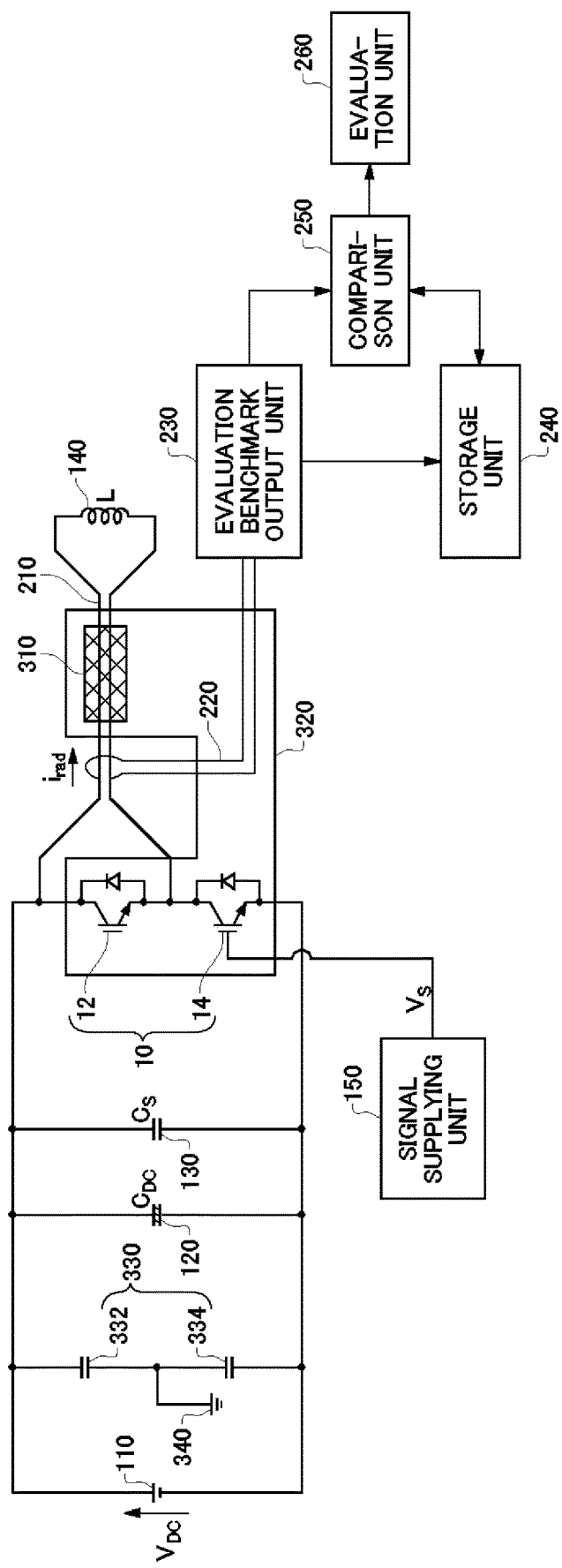
FIG. 6 shows a modification example of the evaluation apparatus 200 according to the present embodiment.

FIG. 6 shows a modification example of the evaluation apparatus 200 according to the present embodiment. In the evaluation apparatus 200 in this modified example, operations substantially the same as the operations of the evaluation apparatus 200 according to the present embodiment shown in FIG. 3 are given the same reference numerals, and thus the descriptions are not repeated. The evaluation apparatus 200 in this modified example further include a metal shield 310, a conductive member 320, and a third capacitive unit 330.

The metal shield 310 covers at least part of the load cable 210. That is, at least part of the load cable 210 is covered with the metal shield 310. The metal shield 310 shields the load cable 210 from electrical disturbance, and makes the stray capacitance between the load cable 210 and the metal shield 310 remain at a substantially constant, stable value. Here, a stray capacitance between the metal shield 310 and the load cable 210 is referred to as the first stray capacitance. Also, the metal shield 310 is electrically connected to the conductive member 320 to which the semiconductor device 10 is attached having an insulation material between the semiconductor device 10 and the conductive member 320. Note that, the detection unit 220 is desired to be provided at an area different from an area of the cable that is covered with the metal shield 310.

The conductive member 320 is part of a temperature adjustment unit for adjusting the temperature of the semiconductor device 10. For example, the conductive member 320 is part of at least one of a heater, a cooling device, and heat dissipation fins. The metal shield 310 and the conductive member 320 are desired to be fixed stable. The metal shield 310 and the conductive member 320 are, as an example, fixed with screws formed of metal material. Thereby, the contact resistance between the metal shield 310 and the conductive member 320 can be remained at a substantially constant, stable value. Here, a contact resistance between the metal shield 310 and the conductive member 320 is referred to as a first contact resistance.

Also, the conductive member 320 has a function of stably maintaining the ambient temperature of the semiconductor device 10. Therefore, it is desirable for the conductive member 320 to be directly fixed to the semiconductor device 10. Also, the conductive member 320 is desired to be fixed also on the substrate on which the semiconductor device 10 is fixed. In this manner, the stray capacitance between the semiconductor device 10 and the conductive member 320 can be maintained at a substantially constant, stable value. Here, the stray capacitance between the semiconductor device 10 and the conductive member 320 is referred to as a second stray capacitance.

With the metal shield 310 and the conductive member 320, a closed circuit from the semiconductor device 10, through the load cable 210, the first stray capacitance, the first contact resistance, the conductive member 320, the second stray capacitance, and back to the semiconductor device 10, is formed. The closed circuit has the stable stray capacitances, and is a path for common-mode current to flow therethrough. Here, the stray capacitances of the closed circuit can be made larger than the stray capacitance between the load cable 210 and the reference potential. Accordingly, the common-mode current flowing through the load cable 210 flows through the path with the almost stable stray capacitance, leading to a current value, having good stability and reproducibility.

The evaluation apparatus 200 in this modified example can detect such stable common-mode current, and thus can output the evaluation benchmark having better reproducibility.

Also, the evaluation apparatus 200 of this modified example includes a plurality of capacitive units, each of which is connected parallel to the semiconductor device, and at least one of the plurality of capacitive units may include a plurality of capacitive elements connected in series. FIG. 6 shows an example of the evaluation apparatus 200 in which the third capacitive unit 330 includes a first capacitive element 332 and a second capacitive element 334. A point between the first capacitive element 332 and the second capacitive element 334 is connected to a reference potential 340.

The third capacitive unit 330 is a known circuit used as an EMC filter for reducing radiated noise. Providing such a circuit allows the evaluation apparatus 200 to have a circuit configuration closer to that to be actually equipped with the semiconductor device 10, and to output an evaluation result with higher accuracy. In addition to the third capacitive unit 330, the evaluation apparatus 200 may be further provided with an EMC filter of the same type and/or a different type, or the like.

As described above, the evaluation apparatus 200 according to the present embodiment can accurately evaluate the radiated noise of the semiconductor device 10 by causing the semiconductor device 10 to perform switching operations. However, when an apparatus or the like is actually equipped with the semiconductor device 10, the switching current of the semiconductor device 10 may vary momentarily. The radiated noise is radiated by the semiconductor device 10 correspondingly to such switching current, and it may be thus different from the radiated noise that is calculated corresponding to the common-mode current during the switching operation.

Such radiated noises have been observed, after actual completion of the apparatus, etc., using dedicated antennas and measurement apparatuses, etc. while the completed apparatus is installed in a radio wave dark room and operates with the switching current, which have caused enormous cost and trouble, etc. However, the evaluation apparatus 200 can output evaluation result having high accuracy for the various switching operations of the semiconductor device 10, and thus, using such evaluation results, the radiated noise that would be generated when the semiconductor device 10 is implemented in apparatuses, etc. can be estimated. A combined evaluation apparatus 300 to estimate the radiated noise of the apparatus equipped with the semiconductor device 10 is described as follows.

Figure 7:
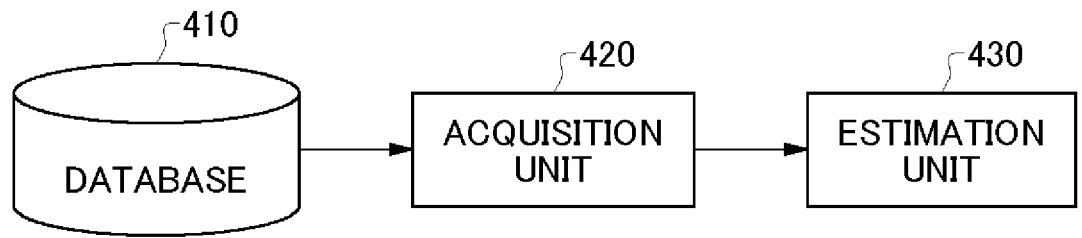
FIG. 7 shows an example configuration of a combined evaluation apparatus 300 in the present embodiment, together with a database 410.

FIG. 7 shows an example configuration of a combined evaluation apparatus 300 according to the present embodiment together with a database 410. The database 410 stores evaluation benchmarks output by the evaluation apparatus 200. It is desirable that the database 410 stores evaluation benchmarks output for a plurality of different switching operations of the semiconductor device 10, each of which is performed under a plurality of different conditions of the common-mode current. The database 410 may be the storage unit 240 of the evaluation apparatus 200. The combined evaluation apparatus 300 uses these evaluation benchmarks to estimate the radiated noise emitted by an apparatus provided with the semiconductor device 10. The apparatus equipped with the semiconductor device 10 is referred to as an equipped apparatus. The combined evaluation apparatus 300 includes an acquisition unit 420 and an estimation unit 430.

The acquisition unit 420 acquires a plurality of evaluation benchmarks for the semiconductor device 10 that are output by the evaluation apparatus 200 in correspondence with switching signals of a plurality of different conditions. For example, the acquisition unit 420 acquires the evaluation benchmarks from the database 410 via a network or the like. The acquisition unit 420 may also be directly connected to the database 410 to acquire the evaluation benchmarks. The acquisition unit 420 may also acquire information of the output current of the semiconductor device 10.

The estimation unit 430 combines the plurality of evaluation benchmarks according to the output current of the semiconductor device 10, to estimate the radiated noise of the equipped apparatus. For example, the estimation unit 430 calculates an estimated value of the radiated noise by summing the radiated electric field strengths of the plurality of evaluation benchmarks corresponding to each of predetermined frequencies. The estimation unit 430 outputs the calculated estimated value.

Figure 8:
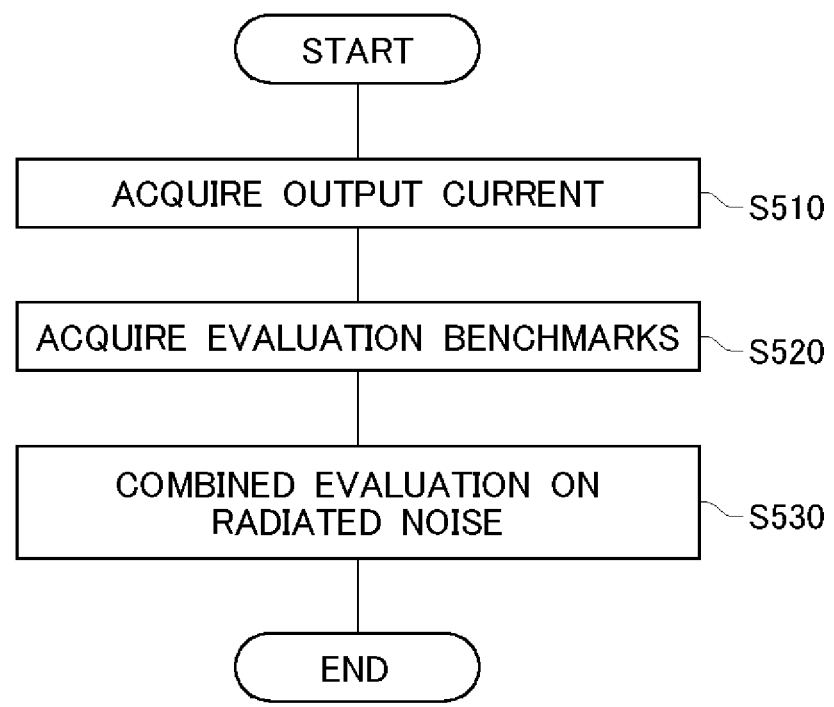
FIG. 8 shows an operation flow of the combined evaluation apparatus 300 according to the present embodiment.

FIG. 8 shows an operation flow of the combined evaluation apparatus 300 according to the present embodiment. The combined evaluation apparatus 300 performs the operations of S510 to S530 shown in FIG. 8 to estimate the radiated noise emitted by the semiconductor device 10 in the equipped apparatus.

First, the current output by the semiconductor device 10 is acquired (S510). The acquisition unit 420 acquires, from the database 410 or the like, information of the current output by the semiconductor device 10 driven by the equipped apparatus. Alternatively, the acquisition unit 420 may be connected to the equipped apparatus to acquire information of the output current from the equipped apparatus. Alternatively, the acquisition unit 420 may receive information of the output current input by a user of the combined evaluation apparatus 300 such as a designer or user of the equipped apparatus.

Next, a plurality of evaluation benchmarks for the semiconductor device 10 that are output by the evaluation apparatus 200 in correspondence with switching operations under a plurality of conditions are acquired (S520). The acquisition unit 420 acquires a combination of a plurality of evaluation benchmarks in correspondence with the output current of the semiconductor device 10. For example, the acquisition unit 420 acquires corresponding evaluation benchmarks according to the polarity, magnitude or the like of the output current. The acquisition unit 420 may also acquire corresponding evaluation benchmarks according to the temporal changes in the drive signal. The acquisition unit 420 may also calculate a plurality of evaluation benchmarks by multiplying the evaluation benchmarks by weights corresponding to the temporal changes in the output current.

Next, the estimation unit 430 combines the plurality of evaluation benchmarks acquired by the acquisition unit 420 according to the output current of the semiconductor device 10, to estimate the radiated noise of the equipped apparatus (S530). For example, the combination of evaluation benchmarks used by the estimation unit 430 is the maximum value or sum of the plurality of evaluation benchmarks for the semiconductor device 10. The combination of evaluation benchmarks used by the estimation unit 430 may also be the average value of the plurality of evaluation benchmarks for the semiconductor device 10. The combination of evaluation benchmarks used by the estimation unit 430 may also be the maximum value or sum and the average value of the plurality of evaluation benchmarks.

For example, the standards for radiated noise of electronic equipment such as defined by International Special Committee on Radio Interference (CISPR) are on the basis of quasi-peak values, average values and the like. Therefore, for compatibility with these standard values, the estimation unit 430 may use the maximum value and average value of the plurality of evaluation benchmarks to estimate the radiated noise. As such, the estimation unit 430 may employ maximum values and average values, and the combined evaluation apparatus 300 may output both of the values. In this case, for example, the quasi-peak value can be predicted to some extent based on the magnitude of the difference between the output maximum and average values, or the like.

The combination of evaluation benchmarks used by the estimation unit 430 may also be the average value calculated after multiplying the plurality of evaluation benchmarks for the semiconductor device 10 by respective weights corresponding to the drive signal for driving the semiconductor device 10.

As described above, the combined evaluation apparatus 300 calculates an estimated value of the radiated noise by combining evaluation benchmarks that are accurately evaluated in advance according to the drive signal for driving the semiconductor device 10, and thus can accurately estimate the radiated noise. The combined evaluation apparatus 300 according to the present embodiment acquires and combines evaluation benchmarks corresponding to switching current from among a plurality of evaluation benchmarks obtained by observing and evaluating common-mode current due to switching operations under various conditions. Thus, the combined evaluation apparatus 300 can use evaluation benchmarks obtained by evaluating respective values of radiated noise corresponding to the common-mode current, and therefore can estimate the radiated noise more accurately.

Figure 9:
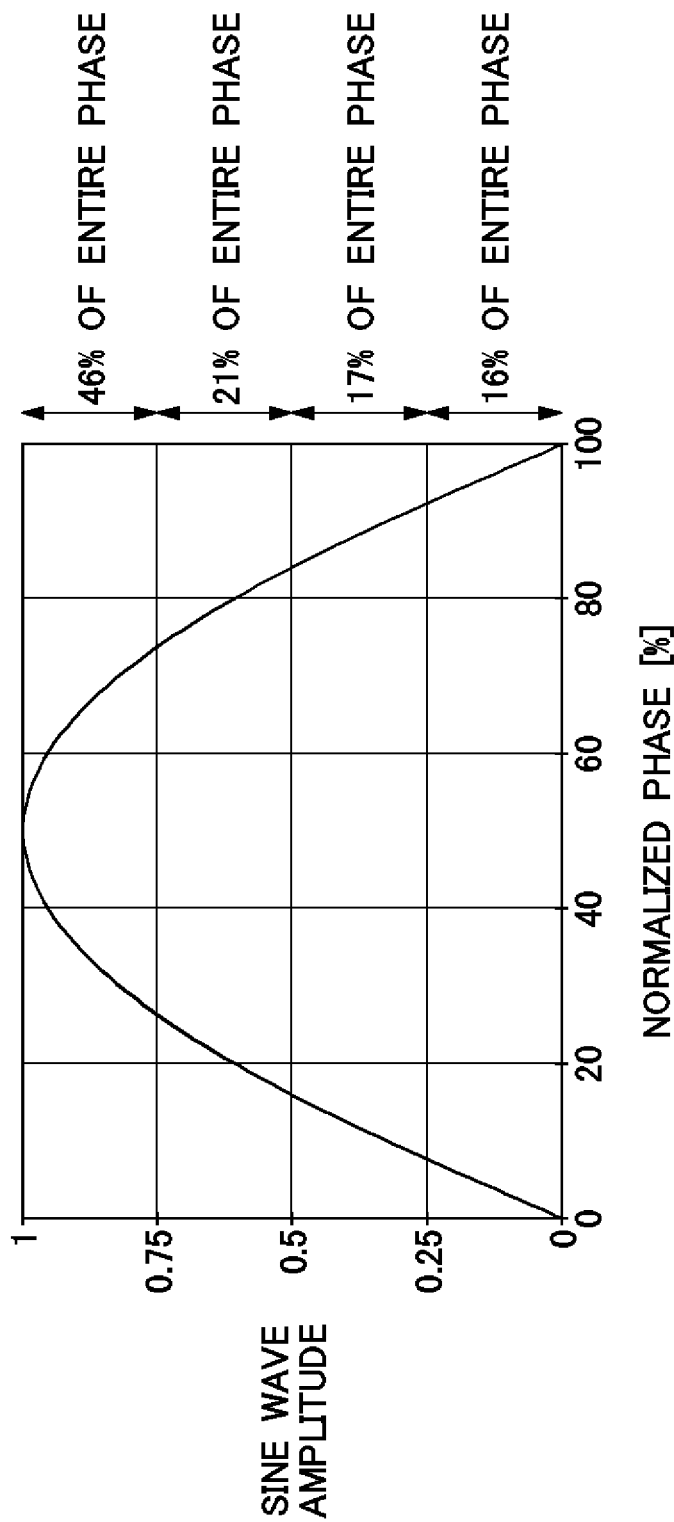
FIG. 9 shows an example of current waveform output by the to-be-evaluated semiconductor device 10 according to the present embodiment.

FIG. 9 shows an example of current waveform output by the to-be-evaluated semiconductor device 10 according to the present embodiment.

Suppose the equipped apparatus is a three-phase inverter, FIG. 9 shows an example of the sine wave output current for a half period of a single phase. In FIG. 9, the horizontal axis represents time, and the vertical axis represents the amplitude value of the output current. Note that, for the values for the horizontal axis and the vertical axis, normalized values are used. Since the output current is part of a sine wave signal, the horizontal axis, which is the time axis in FIG. 9, indicates phases normalized by setting the time corresponding to a phase of 180 degrees as 100%.

When the polarity of the output current is positive as shown in FIG. 9, the acquisition unit 420 acquires an evaluation benchmark output in correspondence with the turn-on operation of the semiconductor device 10, as an example. The acquisition unit 420 may also acquire an evaluation benchmark output by the evaluation apparatus 200 for a condition corresponding to the peak value of the amplitude values of the sine wave output current. The acquisition unit 420 may also acquire an evaluation benchmark output by the evaluation apparatus 200 for a condition closest to the peak value of the amplitude values of the sine wave output current. For example, the acquisition unit 420 multiplies the acquired evaluation benchmark by weights corresponding to the output current to acquire a plurality of evaluation benchmarks.

As an example, the acquisition unit 420 divides the output current into a plurality of regions according to the amplitude value. FIG. 9 shows an example in which the amplitude of the output current is equally divided into four regions of 0 to 0.25, 0.25 to 0.5, 0.5 to 0.75, and 0.75 to 1, with the peak value being 1. The acquisition unit 420 calculates the occupancy of the output current on the time axis in each region. For example, in the region of 0 to 0.25 amplitude, the output current occupies the regions of the first rising and last falling on the time axis. That is, in the region of 0 to 0.25 amplitude, the output current occupies 16% of the 100%, entire phase region, and thus the occupancy is set as 16%.

Similarly, for the acquisition unit 420, the occupancy of the region of 0.25 to 0.5 amplitude is set as 17%, the occupancy of the region of 0.5 to 0.75 amplitude is set as 21%, and the occupancy of the region of 0.75 to 1 amplitude is set as 46%. Such distribution of occupancy can be directly replaced with the generation frequency of output currents in the three-phase inverter operation, and thereby the acquisition unit 420 can calculate a plurality of evaluation benchmarks according to the occupancy.

That is, the acquisition unit 420 calculates a first evaluation benchmark for the region of 0 to 0.25 amplitude by multiplying the voltage of a reference evaluation benchmark, which is obtained for the peak amplitude value of the output current, by 0.16 for each frequency. The acquisition unit 420 also calculates a second evaluation benchmark for the region of 0.25 to 0.5 amplitude by multiplying the reference evaluation benchmark by 0.17. Similarly, the acquisition unit 420 calculates a third evaluation benchmark for the region of 0.5 to 0.75 amplitude and a fourth evaluation benchmark for the region of 0.75 to 1 amplitude by multiplying the reference evaluation benchmark by 0.21 and 0.46, respectively. The estimation unit 430 calculates the per-frequency average value of the four, first to fourth evaluation benchmarks as an estimated value for the radiated noise. The estimation unit 430 outputs the calculated estimated value.

As described above, the combined evaluation apparatus 300 according to the present embodiment uses a plurality of evaluation benchmarks in consideration of the generation frequency of output currents according to the drive signal, and thus can estimate the radiated noise more accurately for various drive signals. Note that, while an example has been described in which the amplitude of the output current is equally divided into four regions in the present embodiment, this is not so limited. The number of division of the amplitude of the drive signal may be set to various number of division. The weights by which the evaluation benchmarks are multiplied and the like may also be adjustable according to the output current.

As described above, the evaluation apparatus 200 and the combined evaluation apparatus 300 according to the present embodiment can estimate the radiated noise that would be caused if an apparatus or the like is equipped with the semiconductor device 10 before the equipment of the apparatus. Also, even if the current output by the semiconductor device 10 is complex, the combined evaluation apparatus 300 can estimate the radiated noise by combining the evaluation benchmarks output by the evaluation apparatus 200.

Also, outputting the evaluation benchmarks output by the evaluation apparatus 200 as a data sheet for the semiconductor device 10 allows providing useful information for facilitating the device design. Note that, in this case, it is desirable that the evaluation apparatus 200 outputs the evaluation benchmarks together with an evaluation result for a previous device. This makes it able to, for example, easily find a benchmark for how much the radiated noise decreases or increases compared to the case of the device previously used, so as to smoothly conduct the device design.

An example of the device design includes determining the driving condition or driving circuit constants for the semiconductor device in advance to meet the international standards. Specifically, the driving condition includes the relationship between the gate voltage value input to the gate terminal of the semiconductor device and time, and the like. Also, the driving circuit constants include a gate resistance value, a gate runner inductance value, a capacitance, the specification of a power supply used, and the like. Furthermore, if the radiated noise generated at the time of turn-on of a semiconductor device in the lower arm of a half-bridge circuit is dominant, for example, the driving condition, driving circuit constants or the like of the semiconductor device in the lower arm is adjusted. The configuration of the apparatus includes providing a shield plate between the semiconductor device with dominant radiated noise and a printed circuit board, determining arrangements in the apparatus according to the intensity of radiated noise, providing a shield plate to the apparatus housing, connecting to the ground, and the like.

For the design of the semiconductor device, internal resistance values or the like of the device may be adjusted. Also, the design of a module equipped with the semiconductor device may include adjustments for insulating substrates, resin insulating substrates and the like such as adjustment of the number of such substrates, circuit patterns formed thereon, thicknesses, current paths, and thicknesses and materials of insulating plates used for the insulating substrates and the like, and the adjustment or the like of the shape, dimension, and material of wirings (wires, lead flames and the like) bonded to surface electrodes formed on the semiconductor device, the adjustment or the like of the shape and material of the housing (case) used for the module.

Note that, while the evaluation apparatus 200 and the combined evaluation apparatus 300 are described as separate, independent apparatuses in the present embodiment, they are not limited to such configuration. For example, the evaluation apparatus 200 and the combined evaluation apparatus 300 may be constituted as a single apparatus. Also, the evaluation apparatus 200 and/or the combined evaluation apparatus 300 may be at least partially constituted with a computer or the like.

Various embodiments of the present invention may be described with reference to flowcharts and block diagrams whose blocks may represent (1) steps of processes in which operations are performed or (2) units of apparatuses responsible for performing operations. Certain steps and units may be implemented by dedicated circuitry, programmable circuitry supplied with computer-readable instructions stored on computer-readable media, and/or processors supplied with computer-readable instructions stored on computer-readable media.

Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc.

More specific examples of computer-readable media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY® disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA®, C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An evaluation method comprising:
   making a semiconductor device that is connected parallel to a load by a load cable, perform a switching operation;
   measuring common-mode current flowing through the load cable during the switching operation; and
   outputting an evaluation benchmark for radiated noise based on the common-mode current, wherein
      the semiconductor device includes a first device and a second device that are connected in series;
      the load cable has:
         a first connection line, one end of the first connection line being connected to one end of the first device;
         a second connection line, one end of the second connection line being connected to the other end of the first device; and
         the load being connected between the other end of the first connection line and the other end of the second connection line; and
      the signal supplying unit is configured to supply the switching signal to the second device.

2. The evaluation method according to claim 1, wherein the outputting the evaluation benchmark calculates, as the evaluation benchmark for the radiated noise, radiated electric field strength of a frequency component included in the common-mode current.

3. The evaluation method according to claim 1, wherein at least part of the load cable is covered with metal shield.

4. The evaluation method according to claim 3, wherein the metal shield is electrically connected to a conductive member to which the semiconductor device is attached having an insulation material between the semiconductor device and the conductive member.

5. The evaluation method according to claim 4, wherein the conductive member is part of a temperature adjustment unit to adjust a temperature of the semiconductor device.

6. The evaluation method according to claim 1, further comprising:
   comparing the evaluation benchmark output for the semiconductor device and an evaluation benchmark output for a reference device different from the semiconductor device; and
   evaluating an intensity of the radiated noise of the semiconductor device relative to the reference device according to a result of the comparison.

7. A combined evaluation method for estimating radiated noise of an apparatus provided with the semiconductor device, the combined evaluation method comprising:
   acquiring a plurality of evaluation benchmarks for the semiconductor device that are output in correspondence with the switching operation under a plurality of conditions by using the evaluation method according to claim 1; and
   combining the plurality of evaluation benchmarks to estimate the radiated noise of the apparatus.

8. The combined evaluation method according to claim 7, wherein the combination of the evaluation benchmarks is a maximum value or a sum of the plurality of evaluation benchmarks for the semiconductor device.

9. The combined evaluation method according to claim 7, wherein the combination of the evaluation benchmarks is an average value of the plurality of evaluation benchmarks for the semiconductor device.

10. The combined evaluation method according to claim 9, wherein the combination of the evaluation benchmarks is an average value calculated after multiplying the plurality of evaluation benchmarks for the semiconductor device by respective weights corresponding to the plurality of conditions.

11. An evaluation apparatus comprising:
    a load that is electrically connected parallel to a semiconductor device;
    a load cable electrically connecting the semiconductor device and the load;
    a signal supplying unit configured to supply predetermined switching signals to the semiconductor device;
    a detection unit configured to detect common-mode current flowing through the load cable; and
    an evaluation benchmark output unit configured to output evaluation benchmarks of radiated noise of the semiconductor device based on a detection result of the detection unit, wherein
       the semiconductor device includes a first device and a second device that are connected in series;
       the load cable has:
          a first connection line, one end of the first connection line being connected to one end of the first device;
          a second connection line, one end of the second connection line being connected to the other end of the first device; and
          the load being connected between the other end of the first connection line and the other end of the second connection line; and
       the signal supplying unit is configured to supply the switching signal to the second device.

12. The evaluation apparatus according to claim 11, wherein at least part of the load cable is covered with metal shield.

13. The evaluation apparatus according to claim 12, wherein the detection unit is provided at an area different from an area of the load cable that is covered with the metal shield.

14. The evaluation apparatus according to claim 12, wherein the metal shield is electrically connected to a conductive member to which a substrate is fixed, and the semiconductor device is arranged on the semiconductor device having an insulation material between the semiconductor device and the substrate.

15. The evaluation apparatus according to claim 14, wherein the conductive member is part of a temperature adjustment unit to adjust a temperature of the semiconductor device.

16. The evaluation apparatus according to claim 11, comprising: a power supply; and a plurality of capacitive units that are each connected parallel to the semiconductor device.

17. The evaluation apparatus according to claim 16, wherein
    at least one capacitive unit of the plurality of capacitive units has a first capacitive element and a second capacitive element that are connected in series, and
    a node between the first capacitive element and the second capacitive element is connected to a reference potential.

18. The evaluation apparatus according to claim 11, wherein the detection unit has a current probe to detect the common-mode current flowing from the first device to the load through the first connection line and the second connection line.

19. The evaluation apparatus according to claim 11, further comprising:

a storage unit configured to store the evaluation benchmark output by the evaluation benchmark output unit; and a comparison unit configured to compare the evaluation benchmark output by the evaluation benchmark output unit and an evaluation benchmark for a reference device different from the semiconductor device stored in the storage unit; and an evaluation unit configured to evaluate a relative change in intensity of the radiated noise of the semiconductor device according to a result of the comparison.

20. A combined evaluation apparatus, comprising:

an acquisition unit configured to acquire a plurality of evaluation benchmarks for the semiconductor device that are output by the evaluation apparatus according to claim 11 in correspondence with the switching signal under a plurality of conditions;

an estimation unit configured to combine the plurality of evaluation benchmarks to estimate radiated noise of an apparatus provided with the semiconductor device.

* * * * *